(12) United States Patent
Kim

(10) Patent No.: US 8,710,939 B2
(45) Date of Patent: Apr. 29, 2014

(54) OSCILLATOR CIRCUIT WHICH COMPENSATES FOR EXTERNAL VOLTAGE SUPPLY, TEMPERATURE AND PROCESS

(75) Inventor: Sang Hun Kim, Cheongju-si (KR)

(73) Assignee: Abov Semiconductor Co., Ltd., Cheongwon-Gun, Chungcheongbuk-Do (KR)

( * ) Notice: Subject to any disclaimer, the term of this patent is extended or adjusted under 35 U.S.C. 154(b) by 40 days.

(21) Appl. No.: 13/501,659

(22) PCT Filed: Nov. 5, 2010

(86) PCT No.: PCT/KR2010/007790
§ 371 (c)(1),
(2), (4) Date: Apr. 12, 2012

(87) PCT Pub. No.: WO2011/065685
PCT Pub. Date: Jun. 3, 2011

(65) Prior Publication Data
US 2012/0229221 A1    Sep. 13, 2012

(30) Foreign Application Priority Data
Nov. 30, 2009 (KR) .................. 10-2009-0117055

(51) Int. Cl.
*H03L 1/00* (2006.01)
(52) U.S. Cl.
USPC .......................................................... 331/176
(58) Field of Classification Search
USPC ................................. 331/176, 175, 34, 183
See application file for complete search history.

(56) References Cited

U.S. PATENT DOCUMENTS 7,456,699 B2 * 11/2008 McCorquodale et al. .... 331/176
7,884,679 B2 * 2/2011 Mahooti ....................... 331/143

FOREIGN PATENT DOCUMENTS

| JP | 09-018234 A | 1/1997 |
| KR | 10-2001-0096856 A | 11/2001 |
| KR | 10-2006-0032441 A | 4/2006 |
| KR | 10-0712554 B1 | 5/2007 |

OTHER PUBLICATIONS

International Search Report of PCT Application No. PCT/KR2010/007790, dated Jun. 29, 2011.
Written Opinion of International Searching Authority for PCT Application No. PCT/KR2010/007790, dated Jun. 29, 2011.

* cited by examiner

*Primary Examiner* — Arnold Kinkead
(74) *Attorney, Agent, or Firm* — Kile Park Reed & Houtteman PLLC

(57) ABSTRACT

Disclosed is an oscillator circuit which compensates for external voltage supply, temperature, and a process, includes: a reference voltage generation unit configured to generate reference voltage Vbp stabilized against a change in external voltage supply VDD and temperature; a temperature compensation unit configured to generate first reference voltage PVREF, second reference voltage IVREF, and third reference voltage RX_VREF; an internal voltage supply generation unit configured to generate internal voltage supply VPPI stabilized against the change in external voltage supply VDD and temperature by receiving the first reference voltage PVREF; a current supply unit configured to generate compensation current RX_IREF in proportion to or in inverse proportion to temperature by receiving the second reference voltage IVREF; a process compensation unit configured to perform process compensation by controlling an amount of the compensation current RX_IREF; and an oscillation signal generation unit configured to generate oscillation signals.

14 Claims, 8 Drawing Sheets

OSCILLATOR CIRCUIT WHICH COMPENSATES FOR EXTERNAL VOLTAGE SUPPLY, TEMPERATURE AND PROCESS

BACKGROUND OF THE INVENTION

1. Field of the Invention

The present invention relates to an oscillator circuit which stably generates an oscillation signal of a predetermined frequency against a change in external voltage supply having a wide range, temperature, and a semiconductor process, and more particularly, to an oscillator circuit, and more particularly, to an oscillator circuit which compensates for external voltage supply having a wide range, temperature, and a semiconductor process capable of stably generating a constant oscillation signal against a change in temperature and a change in process while compensating for a change in a period signal according to voltage supply used for an integrated circuit device and a chip.

2. Description of the Related Art

An oscillator has been widely used to provide a timing signal of electronic devices including a computer, a system, or communication devices, or the like.

The oscillator circuit needs to compensate for external changes in three elements, that is, external voltage supply, temperature, and a process for an oscillator to stably output an oscillation signal.

However, there are problems in that the oscillator in accordance with the related art compensates for only the change in temperature among the three elements to output the oscillation signal that is not precision and does not completely compensate for the change in temperature when the voltage supply and the process are changed.

FIG. 1 illustrates a general oscillator circuit in accordance with the related art.

Referring to FIG. 1, a general oscillator circuit 100 in accordance with the related art is configured to include a resistive element 110, a capacitor 120, a comparator 130, an output pulse generator 140, and a reset circuit 150.

Current I is generated by the resistive element 110 and flows from a power supply source VDD toward a capacitor 120.

The comparator 130 has a first connection end of a connection node N1 that connects the resistive element 110 to the capacitor 120, a second input end that receives reference voltage VREF, and an output end that is connected to the output pulse generator 140.

The output pulse generator 140 outputs the oscillation signal and provides a reset signal for controlling a discharge of the capacitor 120 to the reset circuit 150. The output pulse generator 140 repeatedly performs a charge and discharge of the capacitor 120, such that the oscillator 120 periodically generates the oscillation signal.

However, the general oscillator circuit 100 in accordance with the related art has the following problems.

That is, since the current I is changed according to the voltage supply VDD and a resistance value of the resistive element 110 is changed according to the change in temperature, the current I is consecutively changed. As a result, the oscillator circuit 100 may change the output oscillation signal frequency according to the change in voltage supply VDD and the change in temperature.

FIG. 2 illustrates another oscillator circuit which compensates for temperature in accordance with the related art.

Referring to FIG. 2, an oscillator circuit 200 which compensates for temperature in accordance with the related art is configured to include first and second transistors 211 and 212 that configures a current mirror type circuit 210, a third transistor 220 that controls an amount of first current $I_1$ output from the current mirror type circuit 210 by control voltage Vg, a resistive element 230 that generates second current $I_2$, a capacitor 240 that receives third current $I_3$ that is a sum of the first current $I_1$ and the second current $I_2$, a comparator 250, a reset circuit 260, and an output pulse generator 270.

The capacitor 240 is charged by receiving the third current $I_3$ and the output pulse generator 270 activates the reset circuit 260 to discharge the capacitor 240. The repeated charge and discharge of the capacitor 240 periodically generates the pulse oscillation signal.

However, the oscillator circuit 200 which compensates for temperature in accordance with the related art has also the following problems.

That is, when the external voltage supply and the process are not changed, the supplied third current $I_3$ is constant against the change in temperature. However, when the external voltage supply and the process are changed, there are problems in that the current supply $I_3$ is changed according to the change in temperature and thus, the oscillation signal may not be constantly output.

In addition, there is a problem in that the output oscillation signal frequency are changed according to the change in characteristics of external voltage supply and temperature of the oscillator even though current is supplied thereto, independent of the change in external voltage supply and temperature.

SUMMARY OF THE INVENTION

Accordingly, the present invention has been made in an effort to solve the problems occurring in the related art, and an object of the present invention is to provide an oscillator circuit for stably generating an oscillation signal of a predetermined frequency, independent of a change in external voltage supply having a wide range, temperature, and a process.

In order to achieve the above object, according to one aspect of the present invention, there is provided an oscillator circuit which compensates for external voltage supply, temperature, and a process, including: a reference voltage generation unit 310 configured to generate reference voltage Vbp stabilized against a change in external voltage supply VDD and temperature; a temperature compensation unit 330 configured to generate first reference voltage PVREF, second reference voltage IVREF, and third reference voltage RX_VREF by receiving the reference voltage Vbp; an internal voltage supply generation unit 320 configured to generate internal voltage supply VPPI stabilized against the change in external voltage supply VDD and temperature by receiving the first reference voltage PVREF; a current supply unit 340 configured to generate compensation current RX_IREF increasing or decreasing according to the change in temperature by receiving the second reference voltage IVREF; a process compensation unit 350 configured to perform process compensation by controlling an amount of the compensation current RX_IREF; and an oscillation signal generation unit 360 configured to generate oscillation signals.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
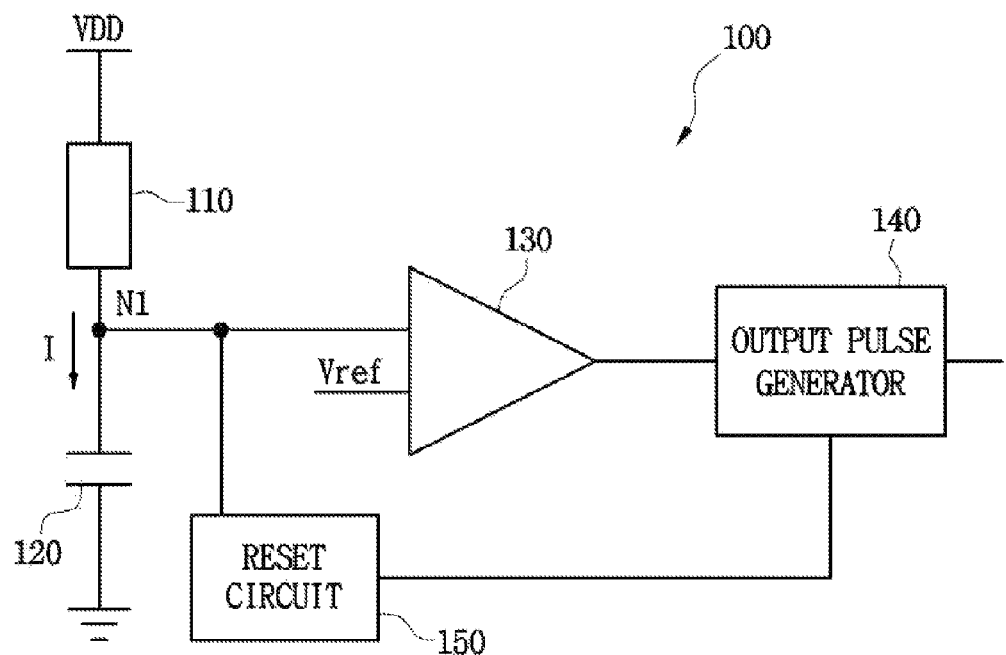
FIG. 1 illustrates a general oscillator circuit in accordance with the related art.
Figure 2:
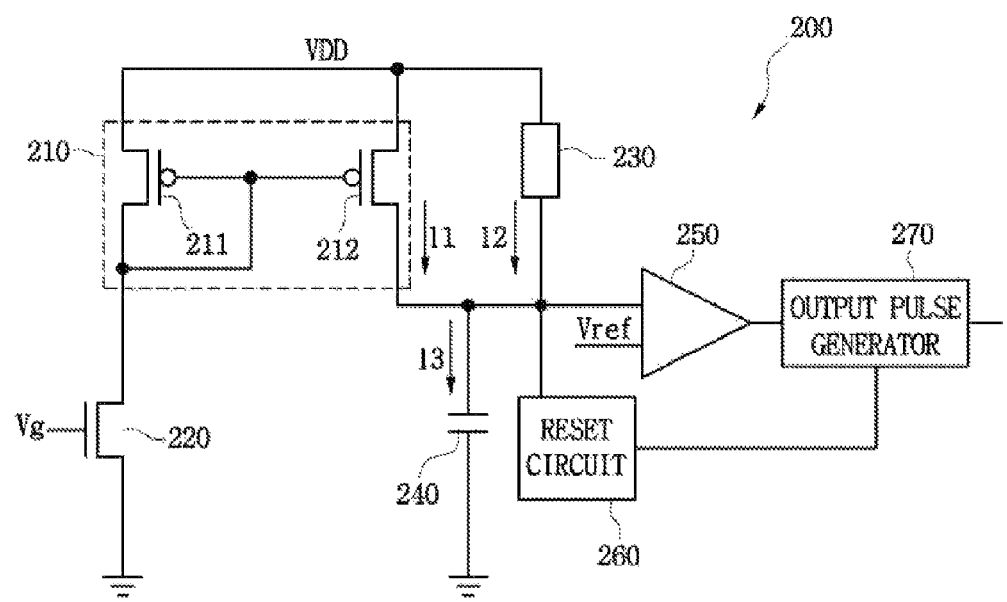
FIG. 2 illustrates another oscillator circuit which compensates for temperature in accordance with the related art.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
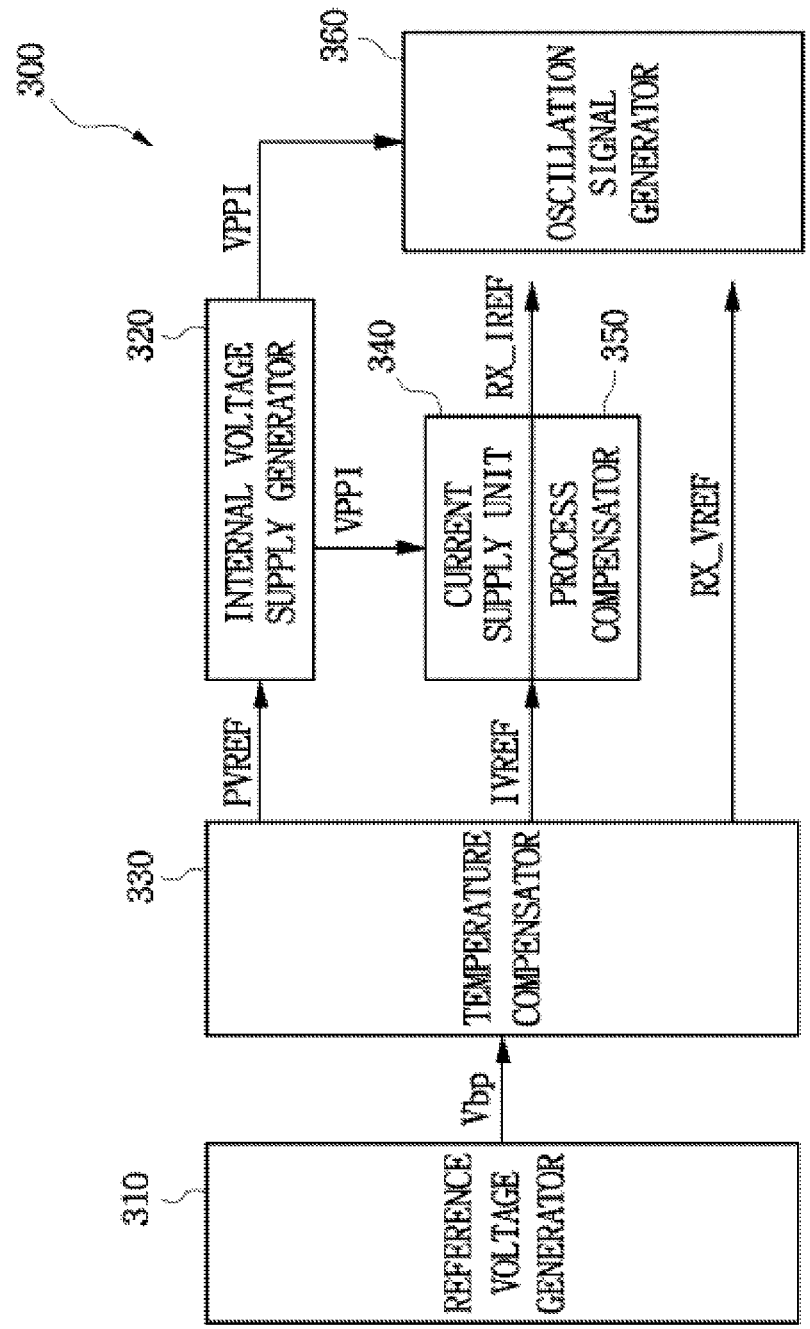
FIG. 3 is a diagram illustrating a configuration of an oscillator circuit in accordance with an embodiment of the present invention.

FIG. 3 is a diagram illustrating a configuration of an oscillator circuit in accordance with an embodiment of the present invention.

Referring to FIG. 3, an oscillator circuit 300 in accordance with an embodiment of the present invention is configured to include a reference voltage generation unit 310, an internal voltage supply generation unit 320, a temperature compensation unit 330, a current supply unit 340, a process compensation unit 350, and an oscillation signal generation unit 360.

Figure 4:
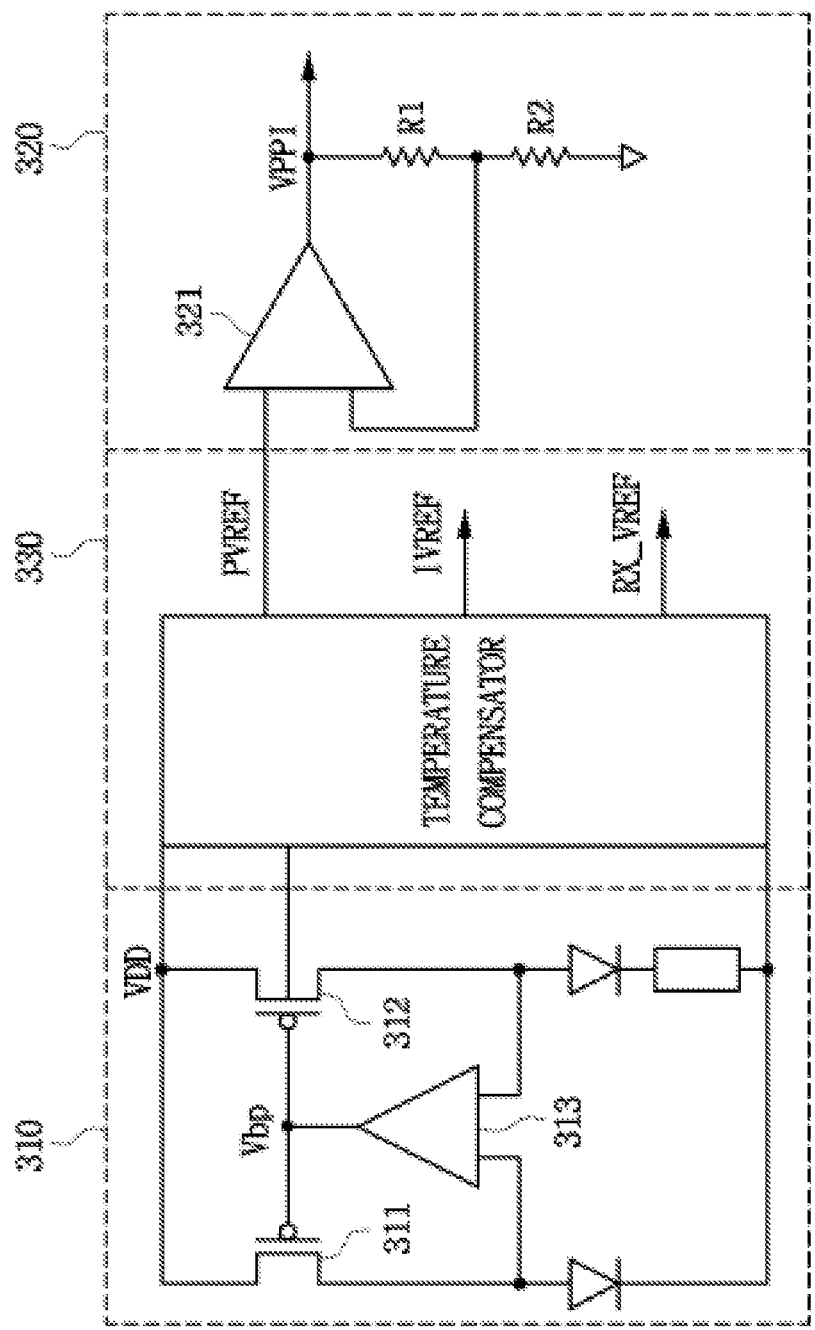
FIG. 4 is a diagram illustrating a circuit configuring a reference voltage generator, a temperature compensator, and an internal voltage supply generator in accordance with the embodiment of the present invention.

Referring to FIGS. 3 and 4, the reference voltage generation unit 310 generates output voltage Vbp of an operational amplifier 313 that controls gates of PMOS transistors 311 and 312 so as to flow constant current to the PMOS transistors 311 and 312 against the change in external voltage supply VDD and temperature, thereby supplying first reference voltage PVREF, second reference voltage IVREF, and third reference voltage RX_VREF to each of the internal voltage supply generation unit 320, the current supply unit 340, and the oscillation signal generation unit 360 through the temperature compensation unit 330.

The internal voltage supply generation unit 320 receives the first reference voltage PVREF and the external voltage supply VDD to supply generated internal voltage supply VPPI to the current supply unit 340, the process compensation unit 350, and the oscillation signal generation unit 360, respectively.

The internal voltage supply VPPI, which is voltage stabilized against the change in external voltage supply VDD and the change in temperature, has a value smaller than that of the external voltage supply VDD.

Referring to FIGS. 3 and 4, the temperature compensation unit 330 receives the Vbp voltage of the reference voltage generation unit 310 and compensates for the received Vbp voltage to increase or decrease according to the change in temperature so as to meet the change in characteristics according to the change in temperature of the internal voltage supply generation unit 320, the current supply unit 340, and the oscillation signal generation unit 360, respectively, thereby generating the first reference voltage VREF, the second reference voltage IVREF, and the third reference voltage RX_VREF and supplying the generated first reference voltage VREF, second reference voltage IVREF, and third reference voltage RX_VREF to the internal voltage supply generation unit 320, the current supply unit 340, and the oscillation signal generation unit 360, respectively.

The current supply unit 340 receives the internal voltage supply VPPI of the internal voltage supply generation unit 320 and receives the second reference voltage IVREF compensated to increase or decrease against the change in temperature by the temperature compensation unit 330, thereby supplying the current RX_IREF of which temperature is compensated to the oscillation signal generation unit 360.

The process compensation unit 350 controls a magnitude in voltage supply from the current supply unit 340 to the oscillation signal generation unit 360 and a magnitude in compensating current RX_IREF of which the change in temperature is compensated, thereby compensating for the change in temperature to output the desired constant oscillation signals against the change in process during the fabricating process and after the fabricating.

The oscillation signal generation unit 360 receives the internal voltage supply VPPI, independent of the change in external voltage supply VDD and the change in temperature of the internal voltage supply generation unit 320, receives third reference voltage RX_VREF of which the temperature is compensated by the temperature compensation unit 330, and receives the compensating current RX_IREF of the current supply unit 340 that is compensated against the change in temperature and the change in process, thereby outputting the stabilized oscillation signal, independent of the change in external voltage supply having a wide range, the change in temperature, and the change in process.

FIG. 4 is a diagram illustrating a circuit configuring a reference voltage generator, a temperature compensator, and an internal voltage supply generator in accordance with the embodiment of the present invention.

Referring to FIGS. 4 and 3, the reference voltage generation unit 310 uses a general bandgap reference circuit or a beta-multiplier reference circuit to generate the reference voltage stabilized against the change in voltage supply and the change in temperature.

The temperature compensation unit 330 receives the output voltage Vbp of the operational amplifier 313 that controls the gates of the transistors 311 and 312 so as to flow the constant current against the change in external voltage supply VDD and temperature to the two PMOS transistors 311 and 312 that are a current source of the reference voltage generation unit 310, thereby generating the first reference voltage PVREF, the second reference voltage IVREF, and the third reference voltage RX_VREF, independent of the voltage supply and the change in increased or decreased temperature.

The circuit of the internal voltage supply generation unit 320 is configured to include the operational amplifier 321 and first and second resistors R1 and R2, wherein the operational amplifier 321 receives the first reference voltage PVREF to a first input end and receives voltage applied to the second resistor R2 connected to a ground part to a second input end. The internal voltage supply generation unit 320 serves to a voltage controlled current source that controls the change in voltage applied to the second resistor R2 to output the constant internal voltage supply VPPI for the current value.

The internal voltage supply generator 330 receives the first reference voltage PVREF generated from the temperature compensating part 320, independent of the change in external voltage supply and the change in temperature, thereby generating the internal voltage supply VPPI having a constant voltage against the change in temperature.

Figure 5:
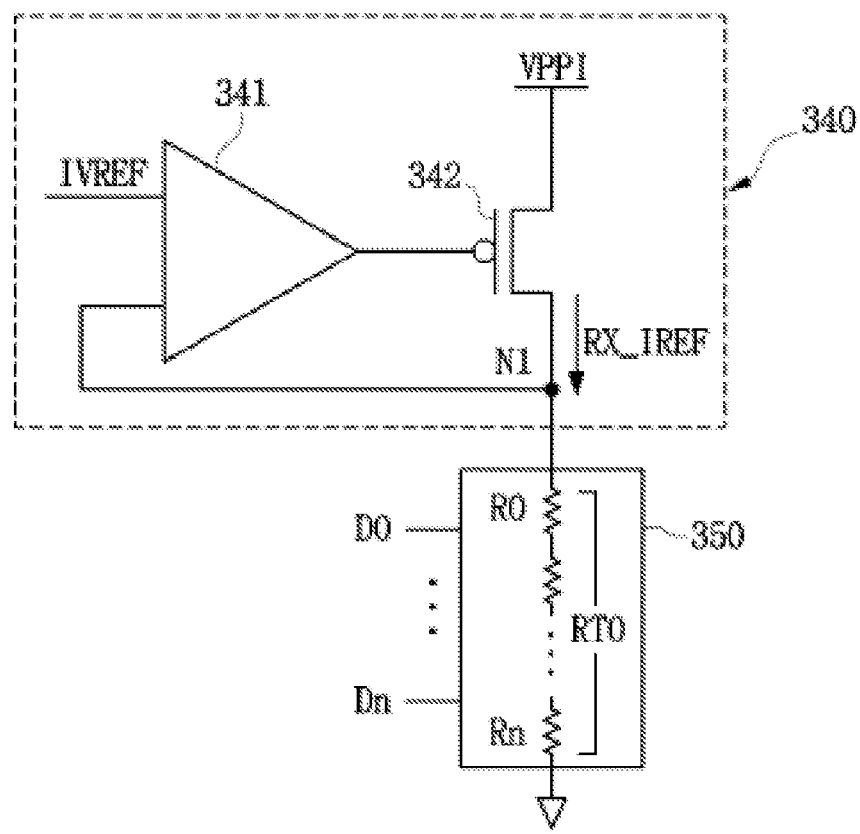
FIG. 5 is a diagram illustrating a circuit configuring a current supply unit and a process compensation unit in accordance with the embodiment of the present invention.

FIG. 5 is a diagram illustrating a circuit configuring a current supply unit and a process compensation unit in accordance with the embodiment of the present invention.

Referring to FIGS. 5 and 3, the current supply unit 340 is configured to include an operational amplifier 341 that detects the change in output and a PMOS transistor 342 of a current source, wherein the operational amplifier 341 receives the second reference voltage IVREF supplied from the temperature compensation unit 330 and voltage applied to a node N1 to control the gate voltage of the PMOS transistor 342 that is a current source.

The current supply unit 340 and the process compensation unit 350 are connected to each other through the node N1.

The process compensation unit 350 includes a plurality of resistors R0, R1, . . . , Rn that are connected with one another in series and controls a total resistance value $R_{TO}$ for the plurality of resistors by controlling digital code values D0, D1, . . . , Dn corresponding to the plurality of resistors R0, R1, . . . , Rn.

The compensating current RX_IREF which compensates for the change in process by the controlled total resistance value $R_{TO}$ is generated, wherein the compensating current RX_IREF is represented by the following Equation 1.

$$RX\_IREF = \frac{IVREF + a}{R_{TO}} \quad \text{[Equation 1]}$$

In Equation 1, a represents a change value in the second reference voltage IVREF. In this case, it may be appreciated that the compensation current RX_IREF increased or decreased according to the change in temperature is generated by using the a.

Figure 6:
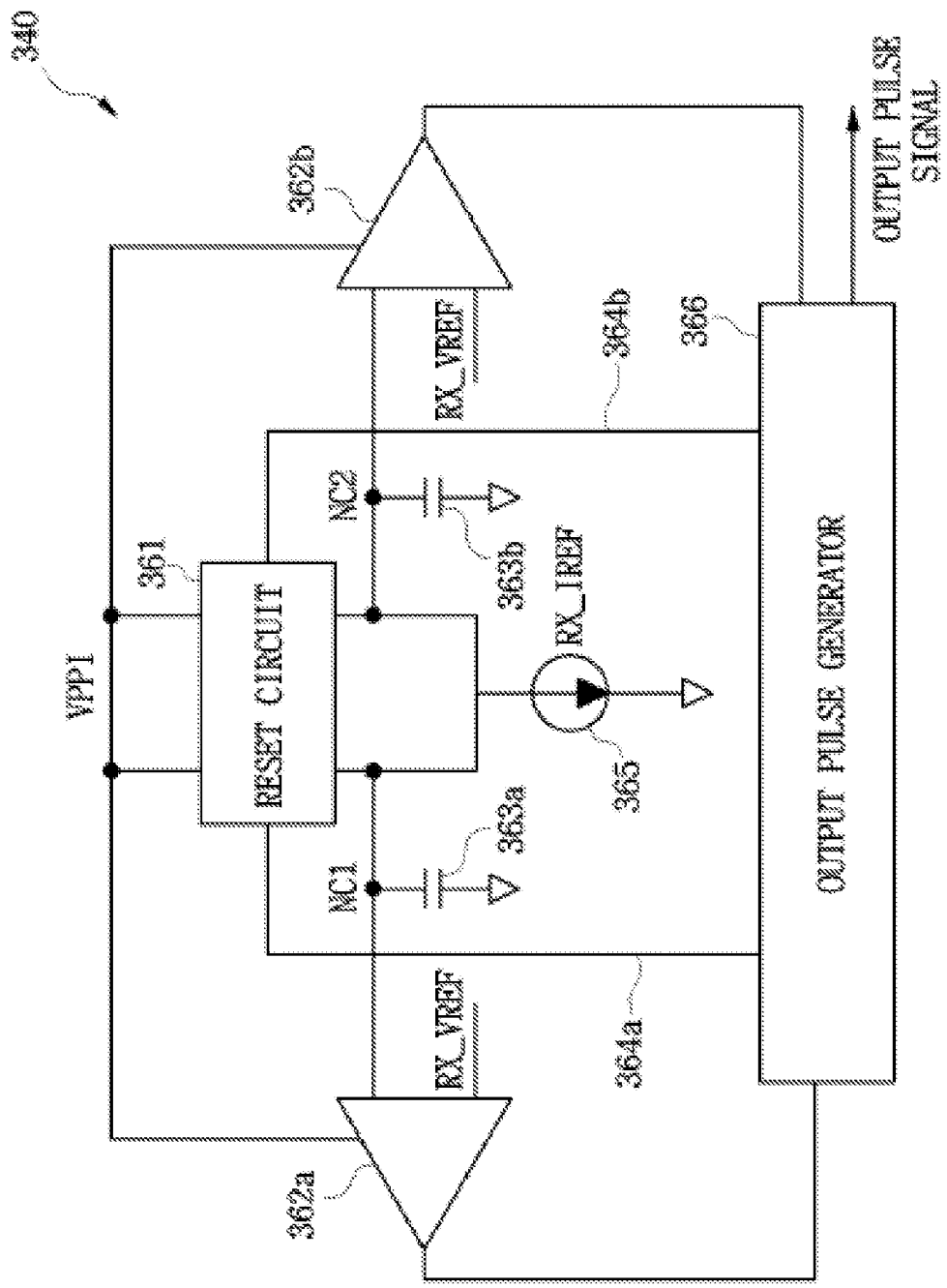
FIG. 6 is a diagram illustrating a circuit configuring an oscillation signal generator in accordance with the embodiment of the present invention.

FIG. 6 is a diagram illustrating a circuit configuring an oscillation signal generator in accordance with the embodiment of the present invention.

Referring to FIGS. 6 and 3, the oscillation signal generation unit 360 is configured to include first and second capacitors 363a and 363b that receives the internal voltage supply VPPI stabilized against the change in external voltage supply VDD and the change in temperature and accumulates charges to generate voltage, first and second comparators 362a and 362b that compares and outputs the third reference voltage RX_VREF with the voltage charged in the first and second capacitors 363a and 363b, respectively, a current source 365 that constantly discharges the compensating current RX_IREF charged in the first and second capacitors 363a and 364b, a reset circuit 361 that charges the charges in the first and second capacitors 363a and 363b, respectively, and an output pulse generator 366 that generates and outputs pulses.

Hereinafter, a circuit operation of the oscillation signal generation unit 360 in accordance with the embodiment of the present invention will be described.

Describing only a circuit operation of a first node NC1, when voltage of the first NC1 is smaller than the third reference voltage RX_VREF, an output of the first comparator 362a has a low logic level. On the other hand, when the voltage of the first node NC1 is higher than the third reference voltage RX_VREF, the output of the comparator has a high logic level.

The output signal of the first comparator 362a is input to the output pulse generator 366 and the output pulse generator 366 outputs the pulse generation output signal and reset signals 364a and 364b.

The reset signal 364a is provided to the reset circuit 361 to charge the first capacitor 363a. That is, when the output signal of the first capacitor 363a is shifted to a low logic value, the output pulse generator 366 generates the reset signal 364a. The reset signal 364a charges the first capacitor 363 to turn-on the reset circuit 361 so as to increase the voltage of the first node NC1.

On the other hand, when a voltage level of the first node NC1 is substantially increased by the reset circuit 361, the voltage level of the first node NC1 is higher than the reference voltage VREF so as to shift the first comparator 362a to a high logic level, thereby returning the output of the first comparator 362a to a previous state.

The reset circuit 361 implementing the operation may be simply implemented by any circuit designer and therefore, a description of thereof will be omitted.

A circuit operation of a second node NC2 is the same as the circuit operation of the first node NC1.

Consequently, the output pulse generator 366 alternately operates repeatedly the circuit operation of the first node NC1 and the second node NC2 to repeatedly charge and discharge the first and second capacitors 363a and 363b, thereby generating the periodic pulse signal.

Hereinafter, the contents described with reference to FIGS. 3 to 6 will be summarized.

(1) The compensation for the external voltage supply VDD of the oscillator circuit 300 in accordance with the embodiment of the present invention is made by supplying the internal voltage supply VPPI from the internal voltage supply generation unit 320 to the current supply unit 340 and the oscillation signal generation unit 360, respectively, independent of the change in external voltage supply VDD and the change in temperature.

(2) The compensation for the change in temperature of the oscillator circuit 300 in accordance with the embodiment of the present invention is made by controlling the third reference voltage RX_VREF of the temperature compensation unit 330 and the compensating current RX_IREF of the current supply unit 340 to increase or decrease according to the change in temperature so as to meet the change in characteristics according to the change in temperature of the oscillation signal generation unit 360 voltage generation unit 310.

(3) The compensation for the change in process of the oscillator circuit 300 in accordance with the embodiment of the present invention selects a digital code programming the total resistance value $R_{TO}$ of the resistive element of the process compensation unit 350 to control the magnitude in the compensation current RX_IREF of the current supply unit 340, thereby outputting the desired constant output oscillation signal frequency against the change in process during the fabricating process and after the fabricating.

Figure 7:
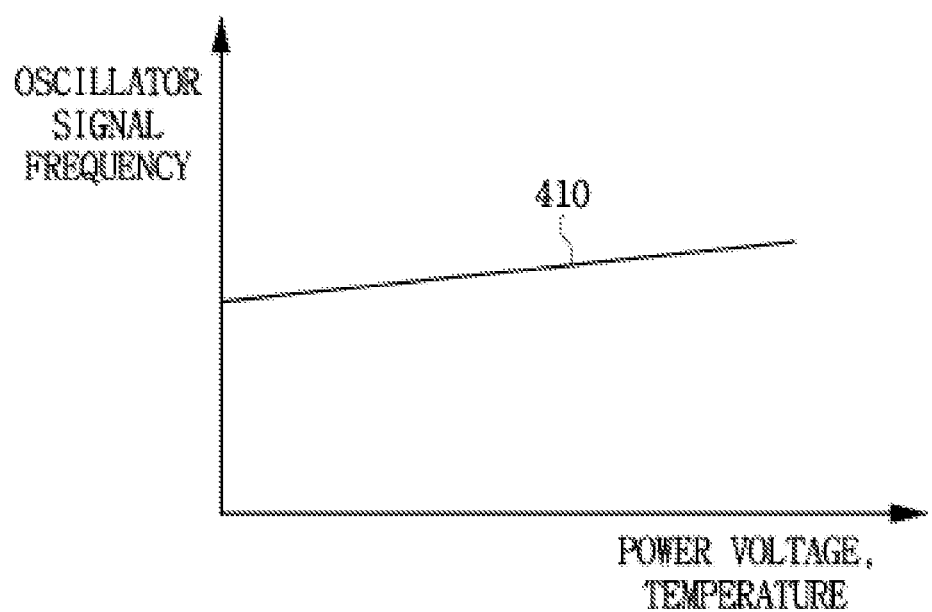
FIG. 7 is a diagram illustrating a relation of an oscillation signal frequency according to a change in power voltage and temperature when internal voltage supply is not used in the related art.

FIG. 7 is a diagram illustrating a relation of the oscillation signal frequency according to the change in power voltage and temperature when the internal voltage supply is not used in the related art.

FIG. 7 illustrates that a slope 410 indicating the change in output oscillation signal frequency according to the change in power voltage and the change in temperature is increased That is, changing the supplied external voltage supply changes the characteristics for the temperature of the oscillation signal generator and thus, the output oscillation signal frequency are changed, even though the current supply is independent of temperature.

Figure 8:
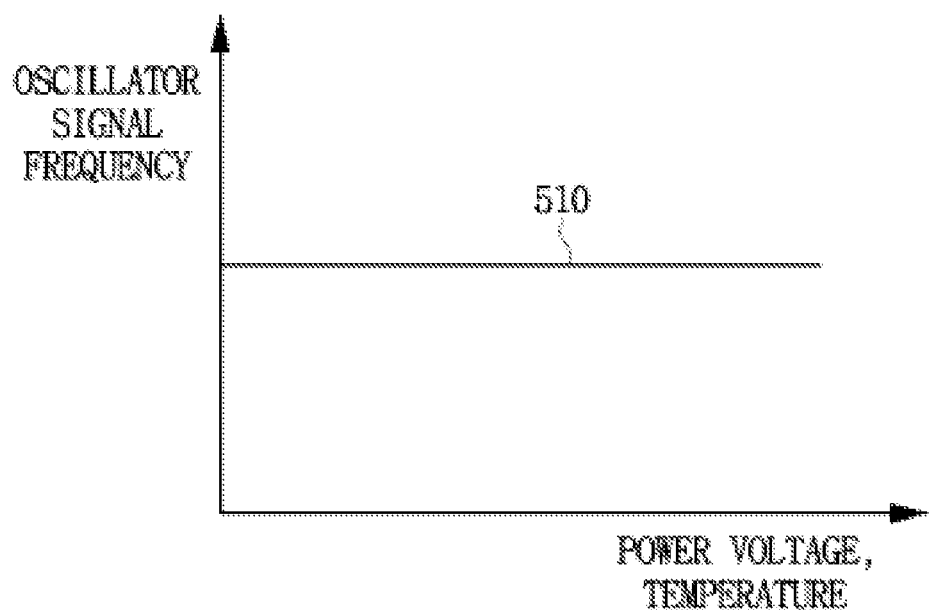
FIG. 8 is a diagram illustrating a relation of an oscillation signal frequency according to the change in power voltage and temperature in accordance with the embodiment of the present invention.

FIG. 8 is a diagram illustrating a relation of the oscillation signal frequency according to the change in power voltage and temperature in accordance with the embodiment of the present invention.

It can be appreciated from FIG. 8 that a slope 510 indicating the change in output oscillation signal frequency according to the change in power voltage and the change in temperature is constant. That is, in the case of the embodiment of the present invention, the output oscillation signal is not fluctuated even in the change in external power voltage and the change in temperature but has a constant magnitude.

Therefore, it can be confirmed that the oscillator circuit 300 in accordance with the embodiment of the present invention generates the oscillation signals of a predetermined frequency, independent of the change in external voltage supply having a wide range, temperature, and a process.

As is apparent from the above description, the present invention can stably generate the oscillation signal of a predetermined frequency, independent of the change in external voltage supply having a wide range, temperature, and a process.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. An oscillator circuit which compensates for external voltage supply, temperature, and a process, comprising:
   a reference voltage generation unit configured to generate reference voltage Vbp stabilized against a change in external voltage supply VDD and temperature;
   a temperature compensation unit configured to generate first reference voltage PVREF, second reference voltage IVREF, and third reference voltage RX_VREF that are each compensated to increase or decrease according to the change in temperature by receiving the reference voltage Vbp;
   an internal voltage supply generation unit configured to generate internal voltage supply VPPI stabilized against the change in external voltage supply VDD and temperature by receiving the first reference voltage PVREF;
   a current supply unit configured to generate compensation current RX_IREF in proportion to or in inverse proportion to temperature by receiving the second reference voltage IVREF;
   a process compensation unit configured to perform process compensation by controlling an amount of the compensation current RX_IREF; and
   an oscillation signal generation unit configured to generate oscillation signals.

2. The oscillator circuit which compensates for external voltage supply, temperature, and a process of claim 1, wherein the temperature compensation unit supplies the first reference voltage PVREF to the internal voltage supply generation unit, supplies the second reference voltage IVREF to the current supply unit, and supplies the third reference voltage RX_VREF to the oscillation signal generation unit.

3. The oscillator circuit which compensates for external voltage supply, temperature, and a process of claim 1, wherein the internal voltage supply generation unit supplies the internal voltage supply VPPI to the current supply unit, the process compensation unit, and the oscillation signal generation unit, respectively.

4. The oscillator circuit which compensates for external voltage supply, temperature, and a process of claim 1, wherein the oscillation signal generation unit receives the internal voltage supply VPPI, the third reference voltage RX_VREF, and the compensation current RX_IREF to generate the oscillation signals having a predetermined size.

5. The oscillator circuit which compensates for external voltage supply, temperature, and a process of claim 1, wherein the current supply unit includes a PMOS transistor configured to be connected between the internal voltage supply VPPI and a ground in series and an operational amplifier configured to receive the second reference voltage IVREF and voltage of a node N1 that is positioned between a drain D of the PMOS transistor and the ground.

6. The oscillator circuit which compensates for external voltage supply, temperature, and a process of claim 5, wherein the current supply unit further includes a process compensation circuit configured to be connected between the node N1 and the ground.

7. The oscillator circuit which compensates for external voltage supply, temperature, and a process of claim 6, wherein the process compensation circuit includes a plurality of resistors.

8. The oscillator circuit which compensates for external voltage supply, temperature, and a process of claim 7, wherein the process compensation circuit controls a total resistance value of the plurality of resistors by controlling digital code values corresponding to the plurality of resistors to control the compensation current RX_IREF.

9. The oscillator circuit which compensates for external voltage supply, temperature, and a process of claim 8, wherein the compensation circuit RX_IREF is represented by $$\text{RX\_IREF} = \frac{IVREF + a}{R_{TO}}.$$

(where a is defined by a value of the change in second reference voltage IVREF according to the change in temperature).

10. The oscillator circuit which compensates for external voltage supply, temperature, and a process of claim 1, wherein the oscillation signal generation unit includes:
   first and second capacitors configured to charge charges in each of them by receiving the internal voltage supply VPPI;
   first and second comparators configured to compare and output the third reference voltage RX_VREF with voltage charged in each of the first and second capacitors;
   a current source configured to constantly discharge the compensation current RX_IREF charged in the first and second capacitors;
   a reset circuit configured to charge the charges in each of the first and second capacitors; and
   an output pulse generator configured to generate and output pulses.

11. The oscillator circuit which compensates for external voltage supply, temperature, and a process of claim 1, wherein the reference voltage generation unit uses a bandgap reference circuit or a beta-multiplier reference circuit.

12. The oscillator circuit which compensates for external voltage supply, temperature, and a process of claim 1, wherein the reference voltage generation unit includes first and second PMOS transistors and an operational amplifier and controls gates of the first and second PMOS transistors by output voltage of the operational amplifier so as to flow current stabilized against the change in external voltage supply VDD and temperature.

13. The oscillator circuit which compensates for external voltage supply, temperature, and a process of claim 12, wherein the output voltage is used as the reference voltage Vbp.

14. The oscillator circuit which compensates for external voltage supply, temperature, and a process of claim 1, wherein the internal voltage supply generation unit is configured to include an operational amplifier and first and second resistors R1 and R2, and the operational amplifier receives the first reference voltage PVREF to a first input end and receives voltage applied to the second resistor R2 connected to a ground part to compare the first reference voltage PVREF with the voltage and then, outputs the internal voltage supply VPPI.

* * * * *